(12) United States Patent
Yokokawa

(10) Patent No.: US 6,344,616 B1
(45) Date of Patent: Feb. 5, 2002

(54) CABLE CAPABLE OF CONNECTING BETWEEN INTEGRATED CIRCUIT ELEMENTS IN A REDUCED SPACE

(75) Inventor: Sakae Yokokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/605,713

(22) Filed: Jun. 27, 2000

(30) Foreign Application Priority Data

Jun. 28, 1999 (JP) ............................................. 11-182549

(51) Int. Cl.[7] ................................................ H01B 7/00
(52) U.S. Cl. ...................................... 174/117 F; 174/36
(58) Field of Search ...................... 174/117 F, 117 FF, 174/36, 110 R, 70 R, 71 R, 72 R

(56) References Cited

U.S. PATENT DOCUMENTS

| | | | | |
|---|---|---|---|---|
| 3,579,206 A | * | 5/1971 | Grange | 340/173.1 |
| 3,818,122 A | * | 6/1974 | Luetzow | 174/86 |
| 3,878,341 A | * | 4/1975 | Balde | 179/98 |
| 4,812,135 A | * | 3/1989 | Smith | 439/493 |
| 4,845,311 A | * | 7/1989 | Scrieiber et al. | 174/36 |
| 4,992,059 A | * | 2/1991 | King et al. | 449/492 |
| 5,025,555 A | * | 6/1991 | Mase | 29/840 |
| 5,042,971 A | * | 8/1991 | Ambrose | 439/77 |
| 5,262,590 A | * | 11/1993 | Lia | 174/36 |
| 5,552,565 A | * | 9/1996 | Cartier et al. | 174/117 FF |
| 5,691,509 A | * | 11/1997 | Balzano | 174/117 F |
| 6,093,894 A | * | 7/2000 | Carlson et al. | 174/117 F |

FOREIGN PATENT DOCUMENTS

JP          62-291876          12/1987

* cited by examiner

Primary Examiner—Anthony Dinkins
Assistant Examiner—William H. Mayo, III
(74) Attorney, Agent, or Firm—Whitham, Curtis & Christofferson, P.C.

(57) ABSTRACT

A cable for use in connection between integrated circuit elements each having terminals. The cable body has an insulator and a plurality of conductors buried in the insulator to have a matrix pattern in section. The cable body has longitudinal end faces as mounting surfaces which are for mounting the integrated circuit elements, respectively. On each of the mounting surfaces, a plurality of conductor pads are formed to connect with the conductors. The conductor pads are connected to the terminals of each of the integrated circuit elements, respectively.

19 Claims, 6 Drawing Sheets

CABLE CAPABLE OF CONNECTING BETWEEN INTEGRATED CIRCUIT ELEMENTS IN A REDUCED SPACE

BACKGROUND OF THE INVENTION

This invention relates to a cable suitable for use in connecting integrated circuit elements (LSIs) to each other and a method of producing the same.

In recent years, in electronic apparatuses such as a large scale computer, high-density mounting of circuit components is progressing following the increase in density of integrated circuits. In the electronic apparatuses of the type, integrated circuit elements are connected by a cable to each other.

Referring to FIG. 1, description will be made about a structure of connecting two integrated circuit elements to each other by the use of a conventional cable. The cable depicted by 91 comprises a cable body 92 and a connector arrangement 93 and is interposed between two circuit boards 94 and 95. The cable body 92 comprises a belt-like flexible substrate. The connector arrangement 93 comprises two connectors 93a and 93b attached to longitudinal opposite ends of the cable body 92, respectively.

The connectors 93a and 93b are releasably attached to connectors 94a and 95a mounted on the circuit boards 94 and 95, respectively. The connectors 94a and 95a are connected to integrated circuit elements 94b and 95b mounted on the circuit boards 94 and 95, respectively. In order to connect the integrated circuit elements 94b and 95b to each other, the connectors 94a and 95a mounted on the circuit boards 94 and 95 are fitted to the connectors 93a and 93b of the cable 91, respectively. As a result, the integrated circuit elements 94b and 95b are connected to each other through the cable 91, the connectors 94a and 95a and the circuit boards 94 and 95.

However, the cable 91 connects the two integrated circuit elements 94b and 95b not directly but through the circuit boards 94 and 95 and the connectors 94a and 95b. Thus, an increased number of parts are required for connection of the integrated circuit elements 94 and 95. In addition, a wide space is required for connection of the integrated circuit elements 94 and 95. This results in a problem that the conventional cable can not cope with the high-density mounting of the electronic apparatuses in recent years.

Japanese Unexamined Patent Publication (JP-A) No. S62-291876 discloses another conventional cable. However, an increased number of parts are also required for connection of a well-known pin grid array package. Therefore, the above-mentioned problem is not solved.

SUMMARY OF THE INVENTION

It is therefore an object of the present invention to provide a cable and a cable assembly for connecting integrated circuit elements to each other, which is capable of reducing a space required for connection of the integrated circuit elements so as to cope with the recent development of high-density mounting in electronic apparatuses.

It is another object of the present invention to provide a method of producing the above-mentioned cable for connecting integrated circuit elements to each other.

Other objects of the present invention will become clear as the description proceeds.

According to an aspect of the present invention, there is provided a cable for use in connection between integrated circuit elements each having terminals. The cable comprises a cable body comprising an insulator and a plurality of conductors buried in the insulator to have a matrix pattern in section. The cable body has longitudinal end faces as mounting surfaces which are for mounting the integrated circuit elements, respectively. The cable further comprises a plurality of conductor pads formed on each of the mounting surfaces and connected to the conductors for being connected to the terminals of each of the integrated circuit elements, respectively.

According to another aspect of the present invention, there is provided a cable assembly which comprises a plurality of cables as mentioned above and a mounting part for mounting one of the integrated circuit elements. The mounting part is placed between the cables and connected to the conductor pads.

According to still another aspect of the present invention, there is provided a method of producing a cable for use in connection between integrated circuit elements each having terminals. The method comprises the steps of preparing a base member and forming a layered body on the base member. The layered body includes an insulator and a plurality of conductors buried in the insulator to have a matrix pattern in section. The method further comprises the steps of removing the base member from the layered body to form a cable blank, cutting longitudinal opposite end portions of the cable blank to form a cable body having longitudinal end faces as mounting surfaces, and forming a plurality of conductor pads on each of the mounting surfaces to be connected to the conductors.

DESCRIPTION OF THE PREFERRED EMBODIMENTS

Figure 1:
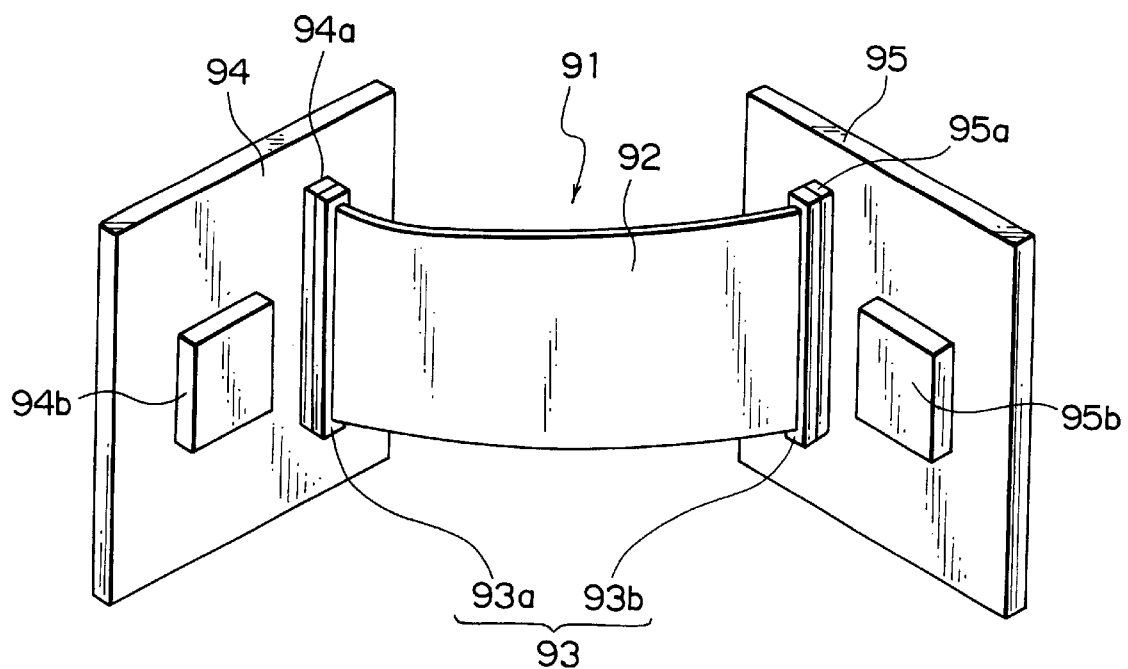
FIG. 1 is a perspective view for describing a structure of connecting between integrated circuit elements by the use of a conventional cable.
Figure 2:
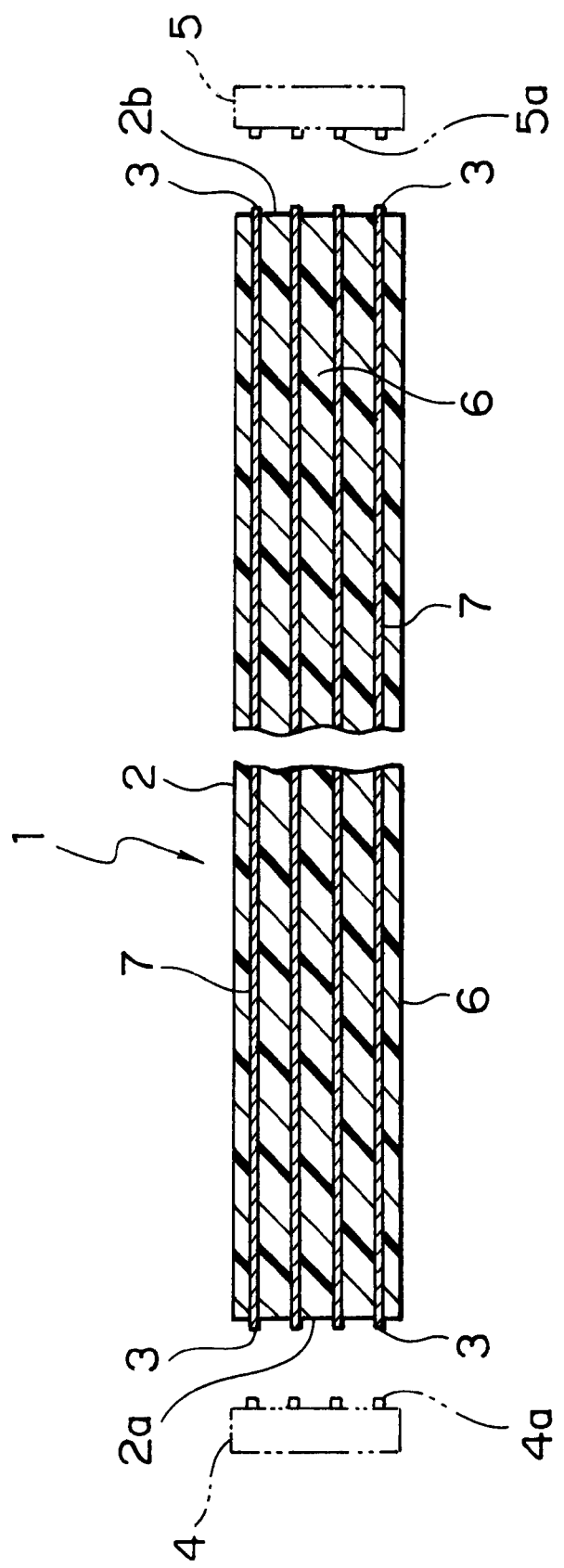
FIG. 2 is a sectional view of a cable according to a first embodiment of this invention.
Figure 3:
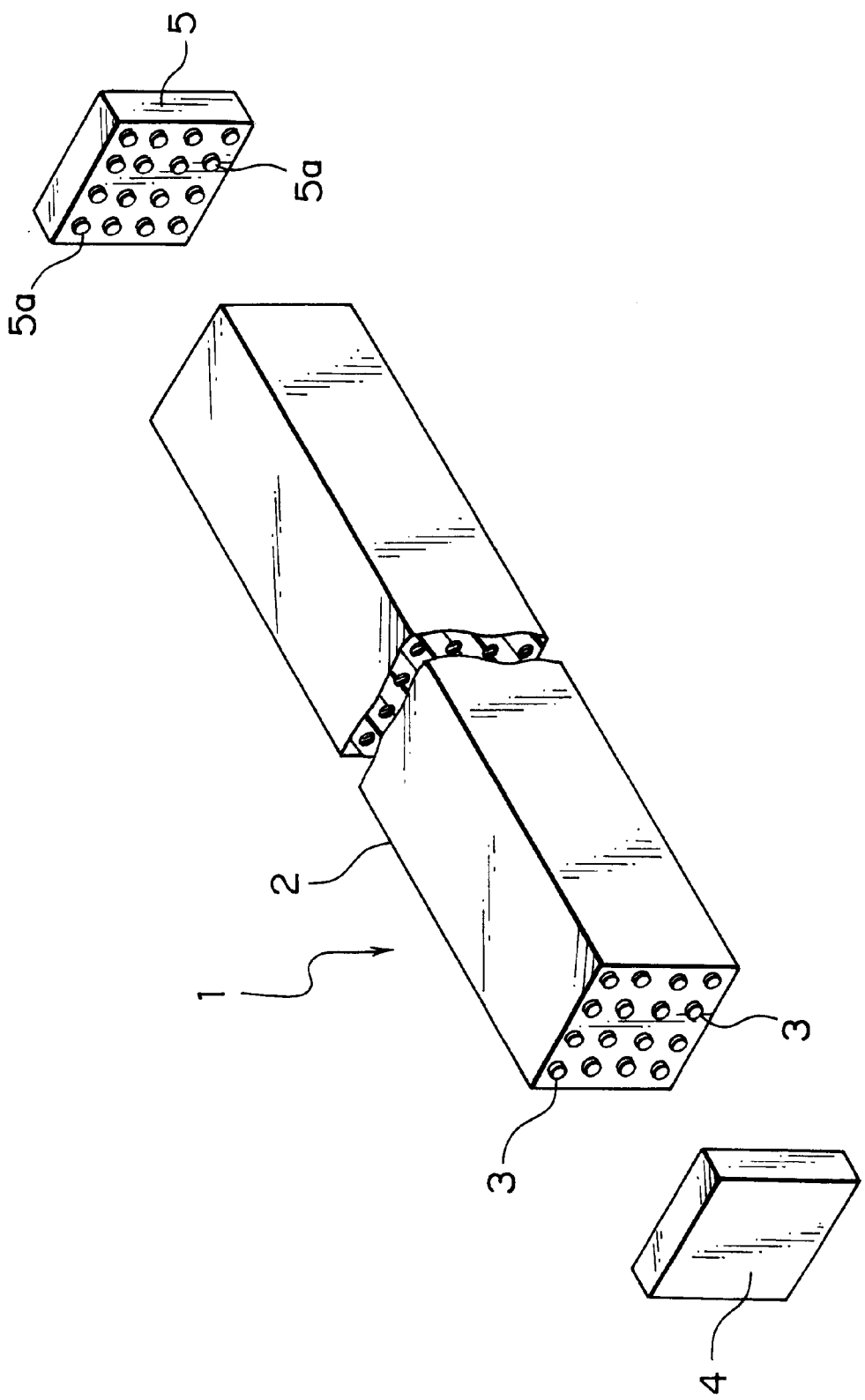
FIG. 3 is a perspective view of the cable of FIG. 2 together with integrated circuit elements.

Referring to FIGS. 2 and 3, description will be made about a cable for connecting integrated circuit elements to each other according to a first embodiment of this invention.

The cable is depicted by a reference numeral 1 and comprises a cable body 2 and a number of conductor pads 3. The cable 1 is adapted to connect two integrated circuit elements 4 and 5 to each other. The integrated circuit elements 4 and 5 have terminals (bumps) 4a and 5a arranged in a predetermined matrix pattern.

The cable body 2 comprises a plurality of insulating layers 6 and a conductor group including a number of conductors 7 buried in the insulating layers 6 and has a flexibility as a whole. The cable body 2 is provided with mounting surfaces 2a and 2b formed longitudinal opposite ends thereof to be perpendicular to layer surfaces of the insulating layers 6. The mounting surfaces 2a and 2b correspond to the integrated circuit elements 4 and 5, respectively. The conductors 7 are arranged to form the predetermined matrix pattern in a section parallel to the mounting surfaces 2a and 2b. Specifically, the conductors 7 are arranged at positions corresponding to mounting positions of the terminals (bumps) 4a and 5a of the integrated circuit elements 4 and 5. The insulating layers 6 and the conductors 7 are made of polyimide (PI) and copper (Cu), respectively.

The cable body 2 is designed to have a total length of about 50 cm. The thickness of the insulating layers 6 and the number of the conductors 7 are appropriately selected considering the size and the pitch (on the order of 0.2 mm to 0.5 mm) of the terminals 4a and 5a of the integrated circuit elements 4 and 5. For simplicity of illustration, each of the number of the conductor pads 3, the number of the terminals 4a, the number of the terminals 5a, and the number of the conductors 7 is equal to four in the figure in each of the vertical and the horizontal directions. However, each of the numbers may be about twenty in each of the vertical and the horizontal directions.

The conductor pads 3 are arranged on each of the mounting surfaces 2a and 2b of the cable body 2 in the predetermined matrix pattern and are connected to the conductors 7 in one-to-one correspondence. The conductor pads 3 serve to connect the conductors 7 to the terminals 4a and 5a of the integrated circuit elements 4 and 5 in one-to-one correspondence. Each of the conductor pads 3 comprises a metal pad such as Cu. The size and pitch of the conductor pads 3 are appropriately selected in conformity with those of the terminals 4a and 5a of the integrated circuit elements 4 and 5.

Next, referring to FIGS. 4A through 4F, the description will be made about a method of producing the cable illustrated in FIGS. 2 and 3.

Figure 4A:
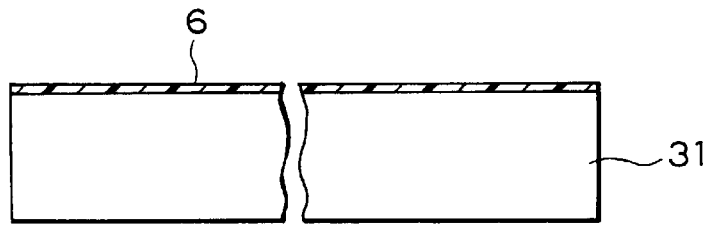
FIGS. 4A through 4F are sectional views for describing a method of producing the cable of FIG. 2.

First, as illustrated in FIG. 4A, the insulating layer 6 is formed by applying liquid polyimide on a base member 31 such as a glass substrate or a silicon substrate and burning.

Figure 4B:
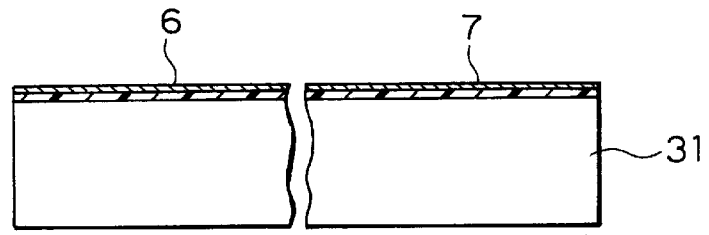

Next, as shown in FIG. 4B, the conductors 7 of twenty in number (only one is shown in the figure) are formed on the insulating layer 6 using the photolithography and the plating to be in parallel to one another in a direction perpendicular to the plane of a drawing sheet. In this event, the pitch of the conductors 7 is determined in correspondence to the horizontal pitch of the terminals 4a and 5a of the integrated circuit elements 4 and 5.

Then, another insulating layer 6 is formed on the insulating layer 6 and the conductors 7. The pitch of the insulating layer 6 is determined in correspondence to the vertical pitch of the terminals 4a and 5a of the integrated circuit elements 4 and 5.

Figure 4C:
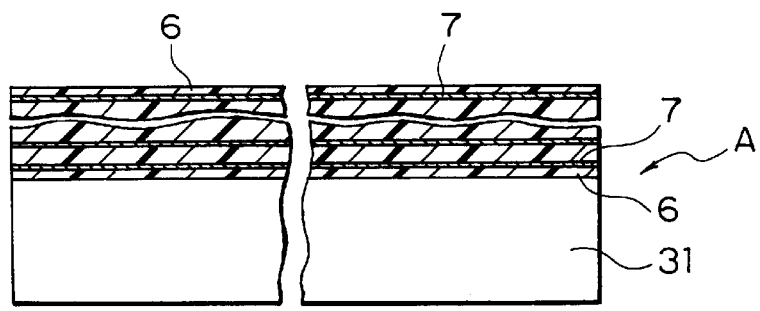

The steps of forming the insulating layers 6 and the step of forming the conductors 7 are alternatively repeated. As a result, as shown in FIG. 4C, a layered body A is formed which comprises a plurality of the insulating layers 6 layered on the base member 31 in a thickness direction of the cable and the conductors 7 buried in the insulating layers 6 in a matrix pattern. A combination of the insulating layers 6 is referred to as an insulator.

Figure 4D:
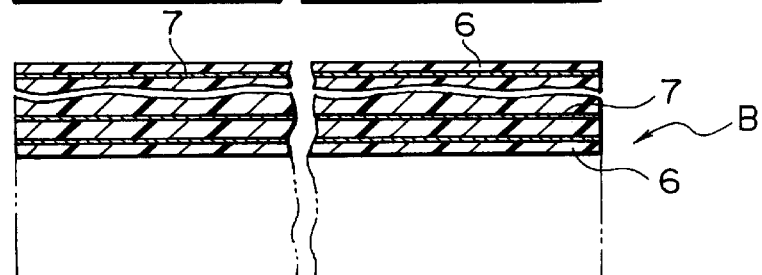

Thereafter, as shown in FIG. 4D, the base member 31 is removed from the layered body A to form a cable blank B.

Figure 4E:
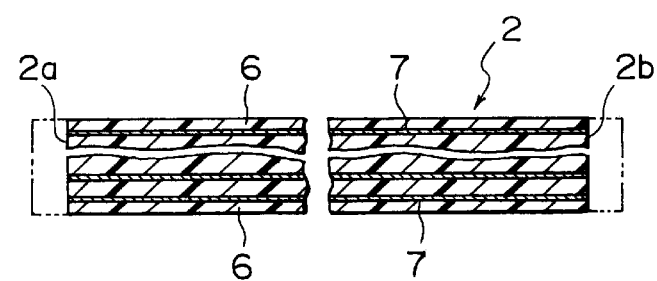
Figure 4F:
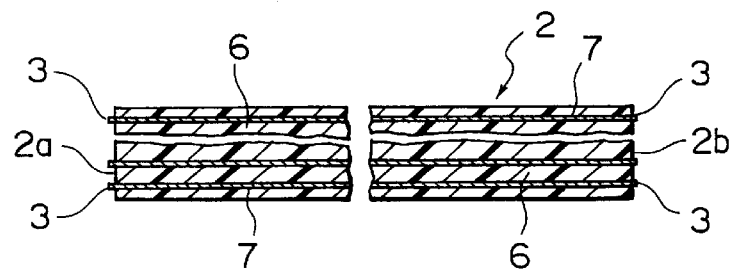

The cable blank B is cut at the longitudinal opposite ends in a direction perpendicular to the layer surface of each insulating layer 6. Then, as shown in FIG. 4E, the cable body 2 is obtained with the mounting surfaces 2a and 2b formed by longitudinal end faces (exposed end surfaces) of the insulating layer 6 and the conductors 7. As shown in FIG. 4F, the conductor pads 3 are formed on the mounting surfaces 2a and 2b of the cable body 2 by the plating. In this event, the conductor pads 3 are formed in the manner such that the deviation in position between the exposed end faces of the conductors 7 and the terminals 4a and 5a of the integrated circuit elements 4 and 5 is adjusted or corrected.

As described above, it is possible to produce the cable for connecting the integrated circuit elements.

With the above-mentioned structure, electric connection between the two integrated circuit elements 4 and 5 is achieved by bringing the conductor pads 3 of the mounting surfaces 2a and 2b and the terminals 4a and 5a of the integrated circuit elements 4 and 5 into contact with each other. Therefore, it is unnecessary to use the circuit boards which are required in the conventional structure of connecting the integrated circuit elements 4 and 5. Thus, the number of components can be reduced to thereby reduce the space for connection of the integrated circuit elements 4 and 5.

Figure 5:
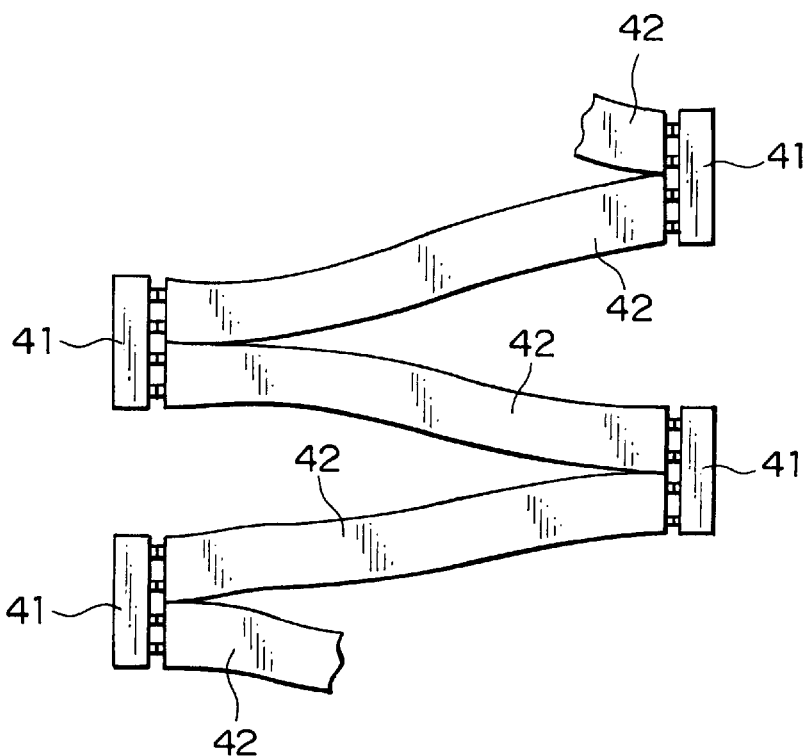
FIG. 5 is a plan view for describing an example of use of the cable of FIG. 2.

In the foregoing, the description is made about the case where a single cable is connected to each single integrated circuit element. However, as shown in FIG. 5, each single integrated circuit element 41 may be connected to two cables 42. Thus, it is possible to connect three or more integrated circuit elements 41 to one another by the use of a plurality of cables 42.

Figure 6:
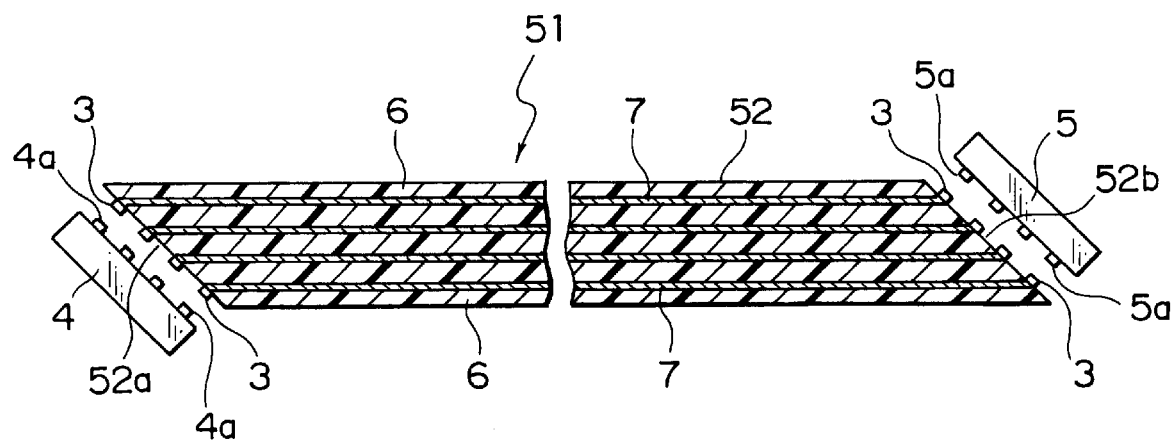
FIG. 6 is a sectional view of a cable according to a second embodiment of this invention together with integrated circuit elements.

Referring to FIG. 6, the description will be made about a cable for connecting integrated circuit elements according to a second embodiment of this invention. Similar parts will be designated by like reference numerals as those used in FIGS. 2 and 3 and the description thereof will be omitted.

The cable is depicted by a reference numeral 51 and comprises a cable body 52 and conductor pads 3. Two integrated circuit elements 4 and 5 are connected to each other via the cable 51.

The cable body 52 comprises a plurality of insulating layers 6 layered in a thickness direction of the cable and a conductor group including a number of conductors 7 buried in the insulating layers 6 in a matrix pattern and has a flexibility as a whole. The cable body 52 is provided with mounting surfaces 52a and 52b formed at longitudinal opposite ends thereof in correspondence to the integrated circuit elements 4 and 5, respectively. The mounting surfaces 52a and 52b have the same inclination with respect to the layer surfaces of the insulating layers 6.

With the above-mentioned structure, reduction in thickness of the insulating layers 6 is achieved without changing the pitch of the conductor pads 3 which is equal to the pitch of the terminals 4a and 5a of the integrated circuit elements 4 and 5. It is therefore possible to reduce the thickness of the cable 51 and to improve the flexibility of the cable 51. Since the conductors 7 are equal in length to each other, signal propagation delays at I/O terminals equal to one another in the integrated circuit elements 4 and 5. Further, since the integrated circuit elements 4 and 5 are directly connected to the mounting surfaces 52a and 52b of the cable body 52, respectively, it is possible to reduce the space for connection of the integrated circuit elements 4 and 5 like in the structure illustrated in FIGS. 2 and 3.

Figure 7:
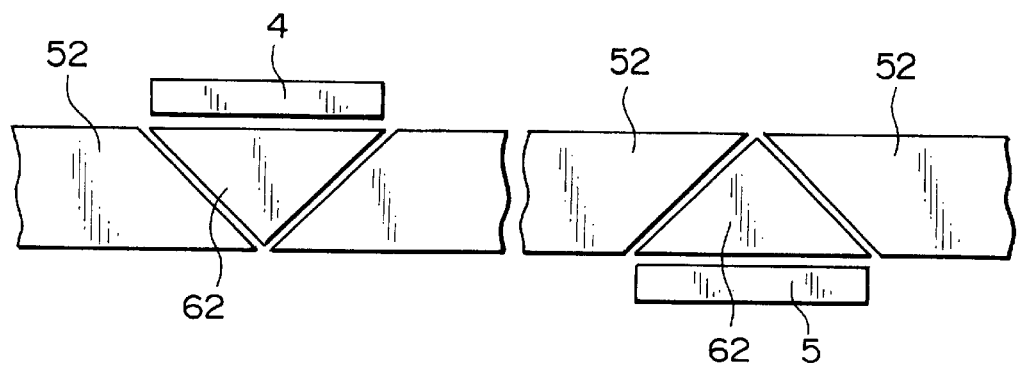
FIG. 7 is a plan view for describing an example of use of the cable of FIG. 6.

In order to connect three or more integrated circuit elements 4 and 5 using a plurality of cables 51, LSI packages 62 as mounting parts are used as shown in FIG. 7. In this event, each of the LSI packages 62 has conductors (not shown) connected to the conductors 7 of the cable 51 and contact holes (not shown) connected to the integrated circuit elements 4 and 5 and is interposed between two cables 51.

Figure 8:
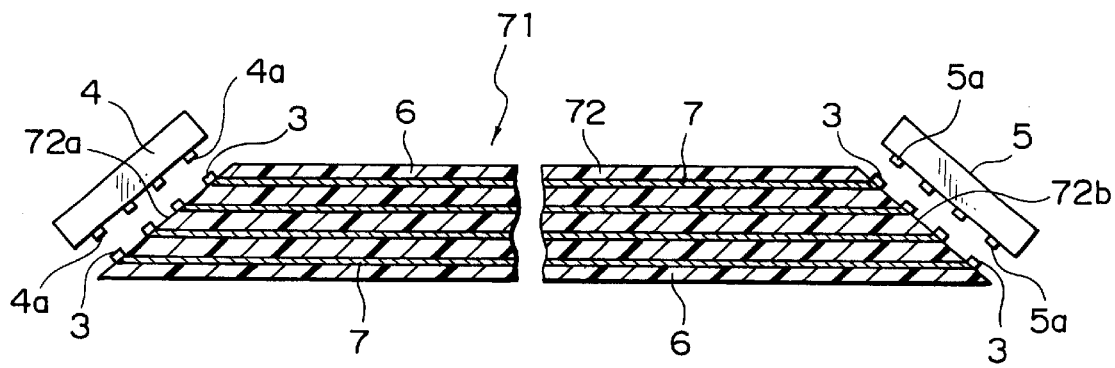
FIG. 8 is a sectional view of a cable according to a third embodiment of this invention together with integrated circuit elements.

Referring to FIG. 8, the description will be made about a cable for connecting integrated circuit elements according to a third embodiment of this invention. Similar parts will be designated by like reference numerals as those used in FIGS. 2 and 3 and description thereof will be omitted.

The cable is depicted by a reference numeral 71 and comprises a cable body 72 and conductor pads 3. Two integrated circuit elements 4 and 5 are connected to each other via the cable 71.

The cable body 72 comprises a plurality of insulating layers 6 and a conductor group including a number of conductors 7 buried in the insulating layers 6 in a matrix pattern and has a flexibility as a whole. The cable body 72 is provided with mounting surfaces 72a and 72b formed at longitudinal opposite ends thereof in correspondence to the integrated circuit elements 4 and 5, respectively. The mounting surfaces 72a and 72b have reverse inclinations with respect to the layer surfaces of the insulating layers 6.

With the above-mentioned structure, the mounting surfaces 72a and 72b are formed on the same side with respect to the integrated circuit elements 4 and 5. Therefore, in case where the integrated circuit elements 4 and 5 are cooled, cooling from only one side is sufficient. Thus, it is possible to simplify the cooling structure. Like the structure shown in FIG. 6, reduction in thickness of the insulating layers 6 can be achieved without changing the pitch of the conductor pads 3. It is therefore possible to reduce the thickness of the cable 51 and to improve the flexibility of the cable 51. Further, since the integrated circuit elements 4 and 5 are directly connected to the mounting surfaces 72a and 72b of the cable body 72, respectively, it is possible to reduce the space for connection of the integrated circuit elements 4 and 5 like in the structures shown in FIGS. 2 and 3 and in FIG. 6.

Figure 9:
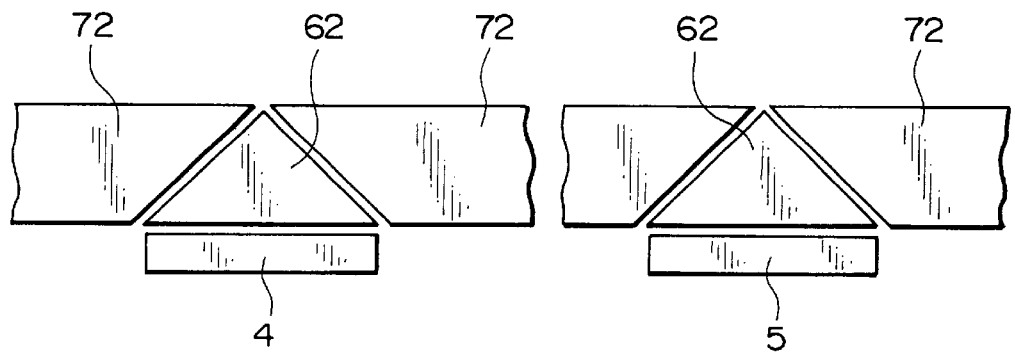
FIG. 9 is a plan view for describing an example of use of the cable of FIG. 8.

In order to connect three or more integrated circuit elements 4 and 5 using a plurality of cables 71, the LSI packages 62 as mounting parts are used as shown in FIG. 9.

In each of the cables mentioned above, it is unnecessary to use the circuit boards which are required in the conventional structure of connecting the integrated circuit elements. Thus, the number of components can be reduced to thereby reduce the space for connection of the integrated circuit elements. It is consequently possible to cope with the recent development of high-density mounting in the electronic apparatuses.

While the present invention has thus far been described in connection with a few embodiments thereof, it will readily be possible for those skilled in the art to put this invention into practice in various other manners. In the foregoing, the description is directed to the case where the formation of the cable body comprising the conductor group including a number of conductors buried in the insulating layers in a matrix pattern is carried out by repeating the step of depositing the insulating layer and the step of forming the conductors on the insulating layer. However, this invention is not limited thereto. For example, the cable body can be formed by the use of the molding technique in which the conductor group is arranged in a mold and a resin melt is supplied in the mold.

What is claimed is:

1. A cable for use in connection between integrated circuit elements each having terminals, comprising:

a cable body comprising an insulator and a plurality of conductors buried in said insulator to have a matrix pattern in section, said cable body having longitudinal end faces as mounting surfaces which are for mounting said integrated circuit elements, respectively; and a plurality of conductor pads formed on each of said mounting surfaces and connected to said conductors for being connected to said terminals of each of the integrated circuit elements, respectively.

2. The cable according to claim 1, wherein said insulator comprises a plurality of insulating layers having layer surfaces facing to each other between adjacent ones of said insulating layers.

3. The cable according to claim 2, wherein said conductors are placed between said adjacent ones of the insulating layers.

4. The cable according to claim 2, wherein at least one of said mounting surfaces is perpendicular to said layer surfaces.

5. The cable according to claim 2, wherein at least one of said mounting surfaces is inclined to said layer surfaces.

6. The cable according to claim 2, wherein said mounting surfaces are parallel to each other.

7. The cable according to claim 2, wherein said mounting surfaces are inclined to said layer surfaces to have inclinations reverse to each other.

8. The cable according to claim 1, further comprising a mounting part for mounting one of said integrated circuit elements, said mounting part being placed on one of said mounting surfaces and connected to said conductor pads of said one of the mounting surfaces.

9. A cable assembly comprising:

a plurality of cables each according to claim 1; and a mounting part for mounting one of said integrated circuit elements, said mounting part being placed between said plurality of cables and connected to said conductor pads, said mounting part further electrically connecting said plurality of cables with said one of said integrated circuit elements.

10. The cable assembly of claim 9, wherein said mounting surfaces are inclined with respect to layer surfaces of insulating layers, said layer surfaces facing each other between adjacent ones of said insulating layers.

11. The cable assembly of claim 9, wherein said mounting surfaces are inclined with respect to layer surfaces of insulating layers having inclinations reverse to each other.

12. A method of producing a cable for use in connection between integrated circuit elements each having terminals, said method comprising the steps of:

preparing a base member;

forming a layered body on said base member, said layered body including an insulator and a plurality of conductors buried in said insulator to have a matrix pattern in section;

removing said base member from said layered body to form a cable blank;

cutting longitudinal opposite end portions of said cable blank to form a cable body having longitudinal end faces as mounting surfaces; and forming a plurality of conductor pads on each of said mounting surfaces to be connected to said conductors.

13. The method according to claim 12, the first-mentioned forming step comprising the steps of:

layer-forming an insulating layer as a part of said insulator;

conductor-forming selected ones of said conductors on said insulating layer to be parallel with one another; and alternately repeating the layer-forming and the conductor-forming steps.

14. A cable for connecting two integrated-circuit modules, each of said modules including a two-dimensional pattern of signal terminals, said cable comprising:

a body having a first end and a second end;

a plurality of conductors arranged in a matrix within said body;

a plurality of conductor pads connected to said plurality of conductors, respectively, said conductor pads being arranged at said first end and second end of said body in said two-dimensional pattern for connection to said signal terminals of said integrated-circuit modules.

15. The cable of claim 14, wherein at least one of said first end and said second end is inclined.

16. The cable of claim 15, wherein said first end and said second end are inclined in reverse directions.

17. An arrangement of integrated-circuit modules, comprising:

a first integrated-circuit module having signal terminals arranged in a first two-dimensional pattern;

a second integrated-circuit module having signal terminals arranged in a second two-dimensional pattern; and a cable having:
(a) a body with a first end and a second end,
(b) a plurality of conductors arranged in a matrix within said body, and
(c) a plurality of conductor pads connected to said plurality of conductors, respectively, said conductor pads arranged at said first end of said body in said first two-dimensional pattern for connection to said first integrated-circuit module, and said conductor pads arranged at said second end of said body in said second two-dimensional pattern for connection to said second integrated-circuit module.

18. The system of claim 17, wherein said first two-dimensional pattern and said second two-dimensional pattern are same.

19. The system of claim 17, wherein said first integrated circuit module includes other signal terminals connected to an end of an additional cable which includes
(a) a body with a first end and a second end
(b) a plurality of conductors arranged in a matrix within said body, and
(c) a plurality of conductor pads connected to said plurality of conductors, respectively, said conductor pads arranged at said first end of the body in said first two-dimensional pattern for connection to said first integrated-circuit module, and said conductor pads arranged at said second end of said body in said second two-dimensional pattern for connection to said second integrated-circuit module.

* * * * *